(12) United States Patent
Venkatraman et al.

(10) Patent No.: US 8,415,739 B2
(45) Date of Patent: Apr. 9, 2013

(54) SEMICONDUCTOR COMPONENT AND METHOD OF MANUFACTURE

(75) Inventors: Prasad Venkatraman, Gilbert, AZ (US); Zia Hossain, Tempe, AZ (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 766 days.

(21) Appl. No.: 12/271,106

(22) Filed: Nov. 14, 2008

(65) Prior Publication Data

US 2010/0123189 A1 May 20, 2010

(51) Int. Cl.
*H01L 21/336* (2006.01)

(52) U.S. Cl. ........ 257/330; 257/331; 257/332; 257/334; 257/510; 257/513; 438/270; 438/272

(58) Field of Classification Search .................. 257/334, 257/340, 509, 330–332, 510, 513; 438/270, 438/272
See application file for complete search history.

(56) References Cited

U.S. PATENT DOCUMENTS

| | | | |
|---|---|---|---|
| 4,455,565 A | 6/1984 | Goodman et al. | |
| 4,941,026 A | 7/1990 | Temple | |
| 5,763,915 A | 6/1998 | Hshieh et al. | |
| 5,877,528 A | 3/1999 | So | |
| 5,912,490 A | 6/1999 | Herbert et al. | |
| 5,998,833 A | 12/1999 | Baliga | |
| 6,388,286 B1 | 5/2002 | Baliga | |
| 6,621,121 B2 | 9/2003 | Baliga | |
| 6,764,889 B2 | 7/2004 | Baliga | |
| 6,787,848 B2 | 9/2004 | Ono et al. | |
| 7,005,347 B1 | 2/2006 | Bhalla et al. | |
| 7,183,610 B2 | 2/2007 | Pattanayak et al. | |
| 2003/0178676 A1* | 9/2003 | Henninger et al. | 257/340 |
| 2006/0273386 A1 | 12/2006 | Yilmaz et al. | |
| 2008/0197407 A1 | 8/2008 | Challa et al. | |
| 2010/0072544 A1* | 3/2010 | Pearse et al. | 257/331 |

OTHER PUBLICATIONS

Ishikawa and Esaki, A High-Power High-Gain VD-MOSFET Operating at 900 MHz, IEEE Transactios on Electron Devices, vol. ED-34, No. 5, pp. 1157-1162, May 1987.
B. Jayant Baliga, "Power Semiconductor Devices," 1996, pp. 81-102, PWS Publishing Company, Boston, USA.

* cited by examiner

*Primary Examiner* — Daniel Whalen
*Assistant Examiner* — Suberr Chi
(74) *Attorney, Agent, or Firm* — Rennie Dover

(57) ABSTRACT

A semiconductor component that includes an edge termination structure and a method of manufacturing the semiconductor component. A semiconductor material has a semiconductor device region and an edge termination region. One or more device trenches may be formed in the semiconductor device region and one or more termination trenches is formed in the edge termination region. A source electrode is formed in a portion of a termination trench adjacent its floor and a floating electrode termination structure is formed in the portion of the termination trench adjacent its mouth. A second termination trench may be formed in the edge termination region and a non-floating electrode may be formed in the second termination trench. Alternatively, the second termination trench may be omitted and a trench-less non-floating electrode may be formed in the edge termination region.

10 Claims, 16 Drawing Sheets

SEMICONDUCTOR COMPONENT AND METHOD OF MANUFACTURE

TECHNICAL FIELD

The present invention relates, in general, to semiconductor components and, more particularly, to power switching semiconductor components having an edge termination structure.

BACKGROUND

Metal-Oxide Semiconductor Field Effect Transistors ("MOSFETS") are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer. When a voltage of sufficient strength is applied to the gate structure to place the MOSFET device in an on state, a conduction channel region forms between the source and drain regions thereby allowing current to flow through the device. When the voltage that is applied to the gate is not sufficient to cause channel formation, current does not flow and the MOSFET device is in an off state.

Today's high voltage power switch market is driven by two major parameters: breakdown voltage ("BVdss") and on-state resistance ("Rdson"). For a specific application, a minimum breakdown voltage is required, and in practice, designers typically can meet a BVdss specification. However, this is often at the expense of Rdson. This trade-off in performance is a major design challenge for manufacturers and users of high voltage power switching devices. Manufacturers of these devices typically include termination structures such as a thick field oxide together with diffused field limiting rings and channel stop regions to reduce device leakage, reduce undesirable parasitic effects, and to enhance device breakdown. These approaches address the problem of maximum electric field relaxation of a planar junction. Each termination approach possesses advantages and disadvantages, and the designer tries to minimize the negative aspects of an approach while simultaneously exploiting the positive aspects. Among these approaches, field-limiting rings are one of the least costly in regards to semiconductor device manufacturing investment, as the same diffusion step used to form the PN junction of the main device can often be used to form the field-limiting rings. These guard rings reduce the electric field curvature while relying on the drift region to block a significant amount of voltage.

Another method for reducing the maximum electric field of a planar junction is the charge balance approach in which charge balancing structures are formed in the device drift region to maintain a substantially uniform electric field within the drift region to increase the breakdown voltage of the device. A drawback with this approach is that edge termination structures in charge balance devices occupy a large area to achieve charge balance at the interface between the active region and the termination region.

Accordingly, it would be advantageous to have a semiconductor component that has a termination structure that provides a higher breakdown voltage and promotes the ability to sustain high avalanche current at the interface between the active region and the termination region and a method for manufacturing the semiconductor component. It would be of further advantage for the semiconductor component to be cost efficient to manufacture.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
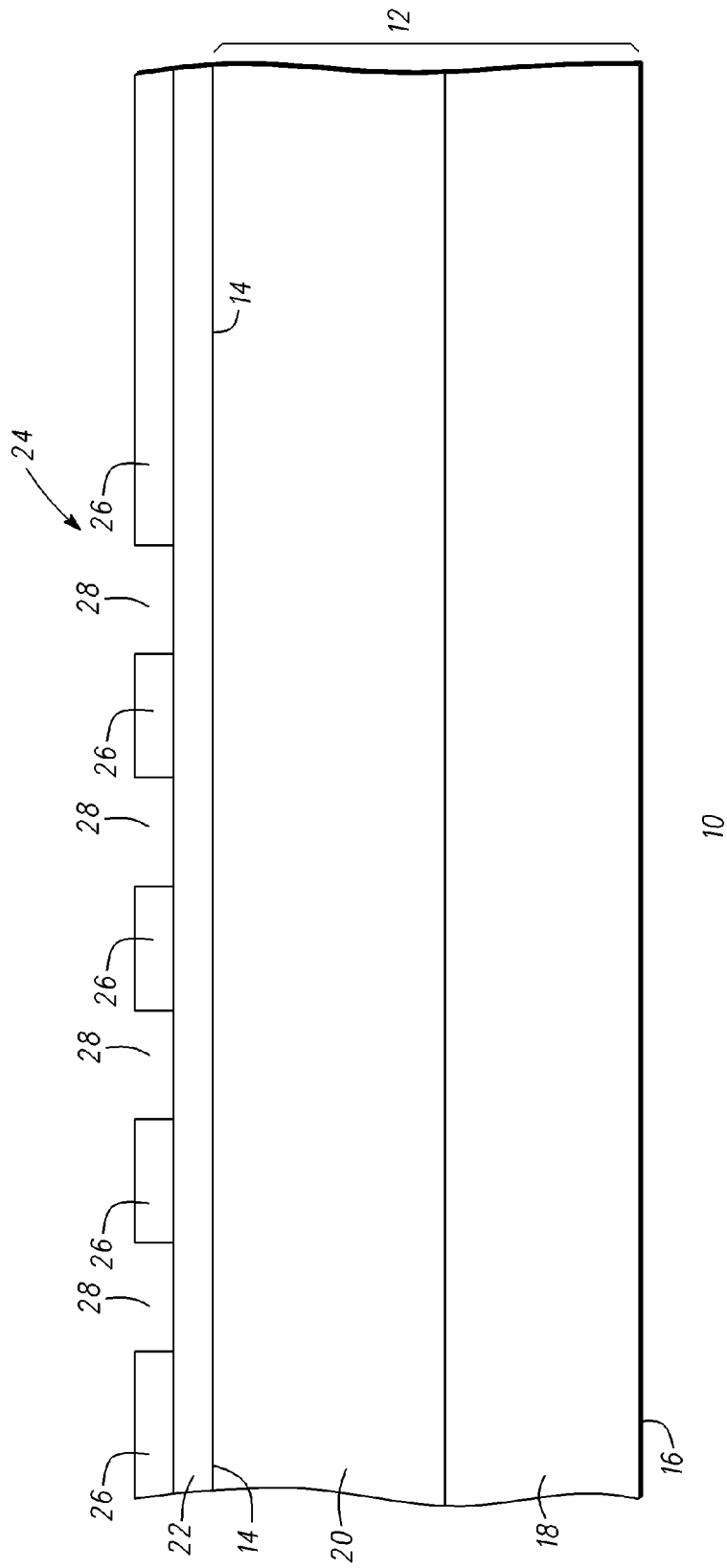
FIG. 1 is a cross-sectional view of a semiconductor component at an early stage of manufacture in accordance with an embodiment of the present invention.

For simplicity of illustration and ease of understanding, elements in the various figures are not necessarily drawn to scale, unless explicitly so stated. In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention to be bound by any expressed or implied theory presented in the preceding text, including the title, technical field, background, or abstract.

DETAILED DESCRIPTION

Generally, the present invention provides a semiconductor component that may include a semiconductor device such as a field effect transistor, a trench field effect transistor, a vertical power field effect transistor, a power field effect transistor, or the like integrated with an edge termination structure that includes a trench. It should be noted that a power field effect transistor may also be referred to as a vertical power device and a vertical field effect transistor may also be referred to as a power device. The semiconductor component comprises a semiconductor device such as, for example, a transistor, and a trench-based edge termination structure that are manufactured or fabricated from a semiconductor material. The portion of the semiconductor material from which the semiconductor device is manufactured may be referred to as a semiconductor device region or a device region and the portion of the semiconductor material from which the trench-based edge termination structure is manufactured may be referred to as a termination region or an edge termination region. It should be noted that a field effect semiconductor device may be a top side drain contact device or a bottom side drain contact device. In a semiconductor device having the top side drain contact or the bottom side drain contact, the drain contact may be made to a region of the semiconductor material that is outside of the semiconductor device region. This region may be referred to as the drain contact region.

In accordance with an embodiment of the present invention, the edge termination structure comprises a trench having sidewalls and a floor. A layer of dielectric material such as, for example, oxide is formed on the floor and the portion of the sidewalls adjacent to the floor and an electrode is formed over the dielectric layer. A layer of dielectric material is formed over the electrode, over the dielectric material adjacent to the floor, and over the sidewalls adjacent to the mouth or opening of the trench and an edge termination electrode is formed over this dielectric material. The electrode closer to the floor is referred to as source electrode because it is coupled to the source electrodes of the semiconductor device, whereas the electrode closer to the opening of the trench is referred to as a floating electrode because it is left floating in an electrical sense.

In accordance with another embodiment of the present invention, the edge termination structure comprises at least two trenches, wherein each trench has a floor and sidewalls. A source electrode and a floating electrode are formed in one of the trenches. In the other trench, a layer of dielectric material is formed over the floor and sidewalls and over a portion of the surface of the semiconductor material and an electrode is formed over the dielectric material and is preferably electrically coupled to the semiconductor material.

FIG. 1 is a cross-sectional view of a portion of a semiconductor component 10 during manufacture in accordance with an embodiment of the present invention. What is shown in FIG. 1 is a semiconductor material 12 having opposing surfaces 14 and 16. Surface 14 is also referred to as a front or top surface and is located at a top side of semiconductor material 12 and surface 16 is also referred to as a bottom or back surface and is located at a bottom side of semiconductor material 12. In accordance with an embodiment of the present invention, semiconductor material 12 comprises an epitaxial layer 20 disposed on a semiconductor substrate 18. Preferably, substrate 18 is silicon that is heavily doped with an N-type dopant or impurity material and epitaxial layer 20 is silicon that is lightly doped with an N-type dopant. In an example of a semiconductor device having a 30 volt breakdown voltage, the resistivity of substrate layer 18 may be less than about 0.01 Ohm-centimeters ("Ω-cm") and preferably less than about 0.005 Ω-cm and the resistivity of epitaxial layer 20 may be greater than about 0.1 Ω-cm and preferably greater than about 0.2 Ω-cm. Substrate layer 18 provides a low resistance conduction path for the current that flows through a power transistor and a low resistance electrical connection to a top drain conductor that may be formed on top surface 14 of substrate 12, a bottom drain conductor that may be formed on bottom surface 16, or both. It should be understood that semiconductor material 12 is not limited to being an epitaxial layer on a semiconductor substrate. For example, semiconductor material 12 can be a semiconductor substrate. A region or layer doped with an N-type dopant is referred to as having an N-type conductivity or an N conductivity type and a region or layer doped with a P-type dopant is referred to as having a P-type conductivity or a P conductivity type.

A layer of dielectric material 22 having a thickness ranging from about 1,000 Angstroms (Å) to about 5,000 Å is formed on or from epitaxial layer 20. In accordance with an embodiment of the present invention dielectric layer 22 is a low temperature oxide ("LTO") having a thickness of about 3,000 Å. The type of dielectric material is not a limitation of the present invention. A layer of photoresist is patterned over oxide layer 22 to form a masking structure 24 having masking elements 26 and openings 28 that expose portions of oxide layer 22. Masking structure 24 is also referred to as a mask or an etch mask.

Figure 2:
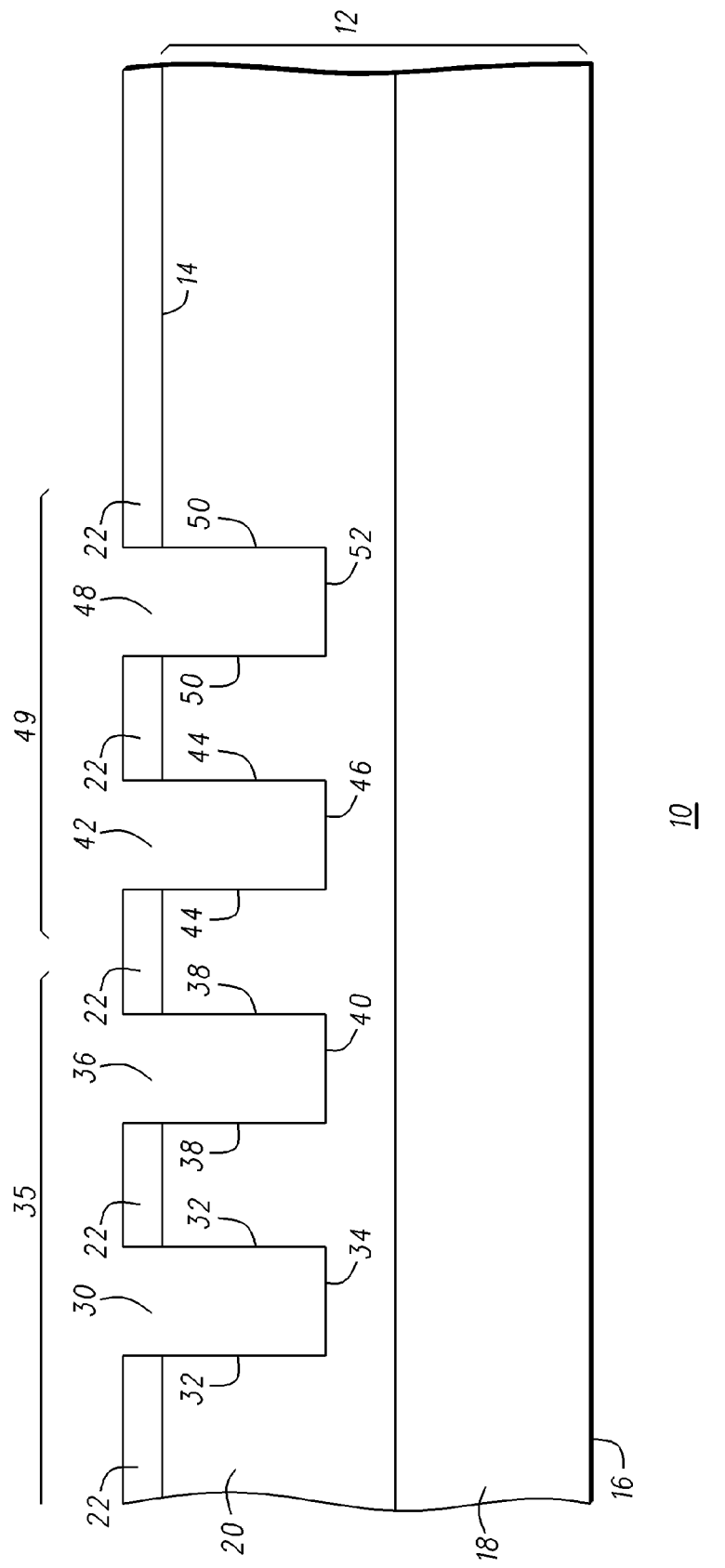
FIG. 2 is a cross-sectional view of the semiconductor component of FIG. 1 at a later stage of manufacture.

Referring now to FIG. 2, the exposed portions of oxide layer 22 and the portions of epitaxial layer 20 below the exposed portions of oxide layer 22 are removed to form trenches 30, 36, 42, and 48 that extend from surface 14 into epitaxial layer 20. Trenches 30 and 36 are formed in semiconductor device region 35 and trenches 42 and 48 are formed in termination or edge termination region 49. Thus, trenches 30 and 36 are referred to as device trenches and trenches 42 and 48 are referred to as termination trenches. Preferably, trenches 30 and 42 are equidistant from trench 36, i.e., the lateral distance between trenches 30 and 36 is substantially the same as the lateral distance between trenches 36 and 42. Trench 30 has sidewalls 32 and a floor 34, trench 36 has sidewalls 38 and a floor 40, trench 42 has sidewalls 44 and a floor 46, and trench 48 has sidewalls 50 and a floor 52. Preferably, trenches 30, 36, 42, and 48 are formed using an anisotropic etch such as, for example, an anisotropic reactive ion etch ("RIE"). Sidewalls 32, 38, 44, and 50 may serve as vertical surfaces and floors 34, 40, 46, and 52 may serve as horizontal surfaces. For the sake of clarity sidewalls 32, 38, 44, and 50 have been shown as being substantially perpendicular to floors 34, 40, 46, and 52. However, it should be understood that in practice floors 34, 40, 46, and 52, i.e., the bottoms of the trenches, may be rounded and sidewalls 32, 38, 44, and 50 may be slightly tapered. Although trenches 30, 36, 42, and 48 are shown as ending in epitaxial layer 20, this is not a limitation of the present invention. For example, trenches 30, 36, 42, and 48 may end at substrate 18 or they may extend into substrate 18. The etching technique and the number of trenches formed in epitaxial layer 20 are not limitations of the present invention.

Figure 3:
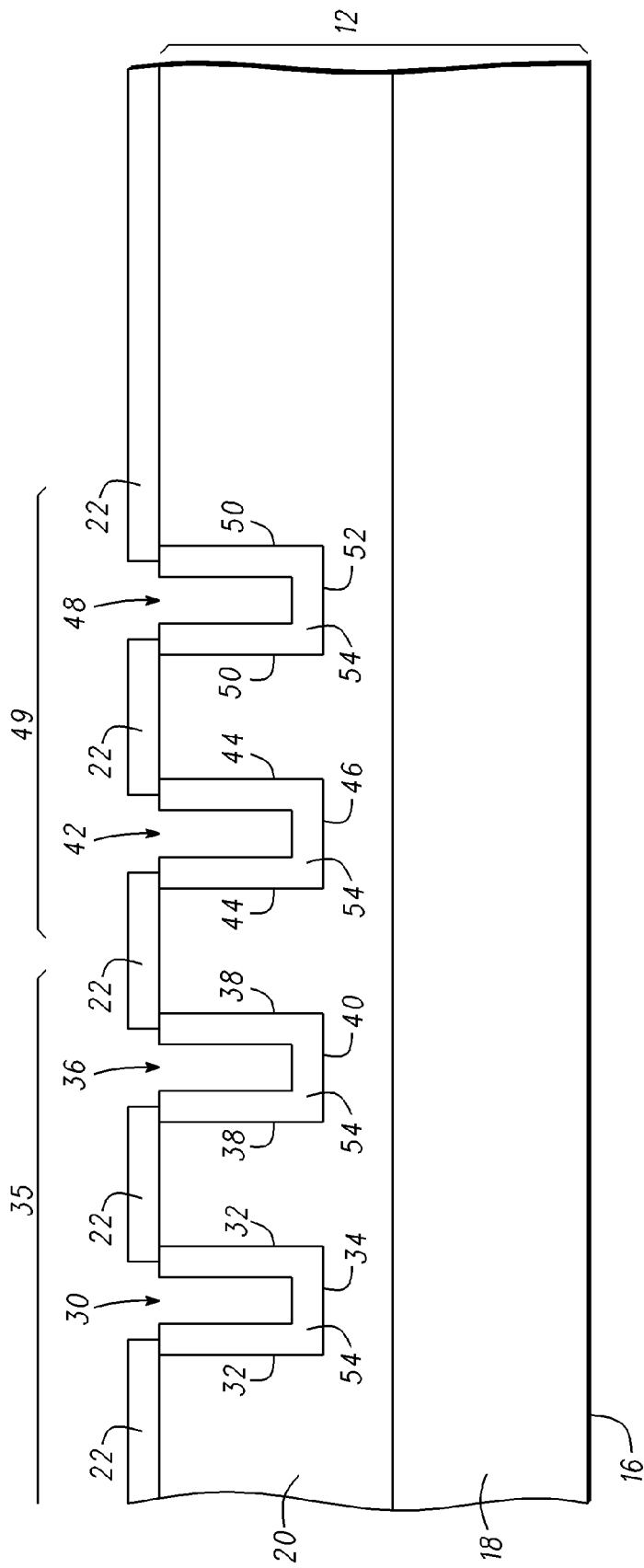
FIG. 3 is a cross-sectional view of the semiconductor component of FIG. 2 at a later stage of manufacture.

Referring now to FIG. 3, a sacrificial dielectric layer 54 having a thickness ranging from about 500 Å to about 2,000 Å is formed from or on sidewalls 32, 38, 44, and 50 and from or on floors 34, 40, 46, and 52. Preferably, dielectric layer 54 is formed by thermal oxidation in a dry ambient. Dielectric layer 54 rounds the bottom and top corners of trenches 30, 36, 42, and 48, removes any damage from sidewalls 32, 38, 44, and 50 and from floors 34, 40, 46, and 52 resulting from the RIE process, provides a high quality surface for subsequent oxidation steps, and widens trenches 30, 36, 42, and 48.

Figure 4:
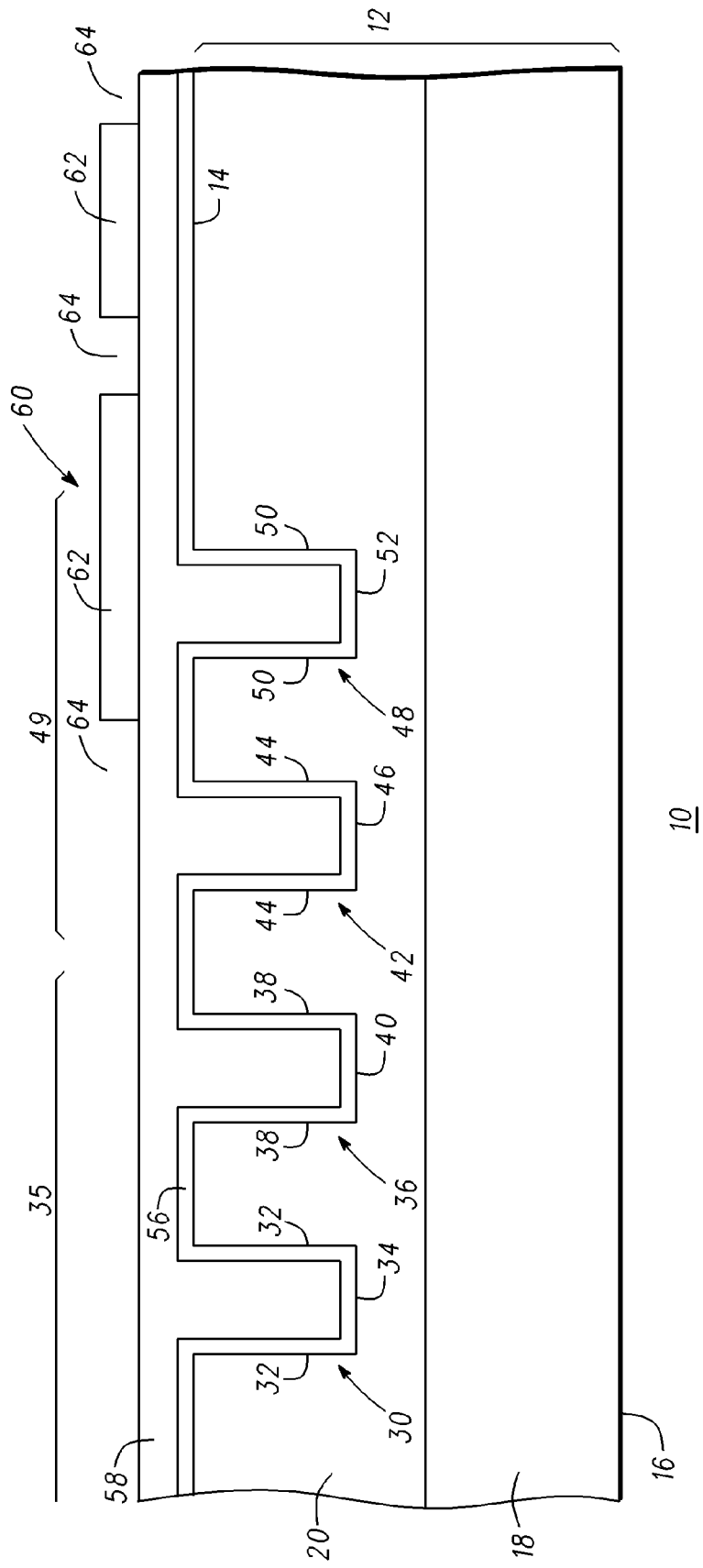
FIG. 4 is a cross-sectional view of the semiconductor component of FIG. 3 at a later stage of manufacture.

Referring now to FIG. 4, sacrificial oxide layer 54 and the remaining portion of oxide layer 22 are stripped from epitaxial layer 20. A layer of dielectric material 56 having a thickness ranging from about 500 Å to about 2,000 Å is formed on surface 14, sidewalls 32, 38, 44, and 50, and floors 34, 40, 46, and 52. It should be noted that the thickness of dielectric layer 56 may be set in accordance with the desired breakdown voltage. For example, for a 30 volt BVDSS, dielectric layer 56 has a thickness ranging from about 800 Å to about 1,200 Å. By way of example, dielectric layer 56 is oxide that may be formed by oxidation of the exposed portions of epitaxial layer 20, decomposition of tetraethylorthosilicate, or the like. A layer of polysilicon 58 having a thickness ranging from about 3,500 Å to about 6,000 Å is formed on dielectric layer 56 and preferably fills trenches 30, 36, 42, and 48. When the conductivity type of epitaxial layer 20 is N-type, the conductivity type of polysilicon layer 58 is preferably N-type. Polysilicon layer 58 is etched to have a substantially planar surface that is about 2,000 Å above the surface of oxide layer 56. Alternatively, polysilicon layer 58 can be planarized using chemical mechanical planarization ("CMP"), resist planarization, oxidation and etch techniques, or the like. A layer of photoresist is patterned over polysilicon layer 58 to form a masking structure 60 having masking elements 62 and openings 64 that expose portions of polysilicon layer 58. Masking structure 60 is also referred to as a mask or an etch mask.

Figure 5:
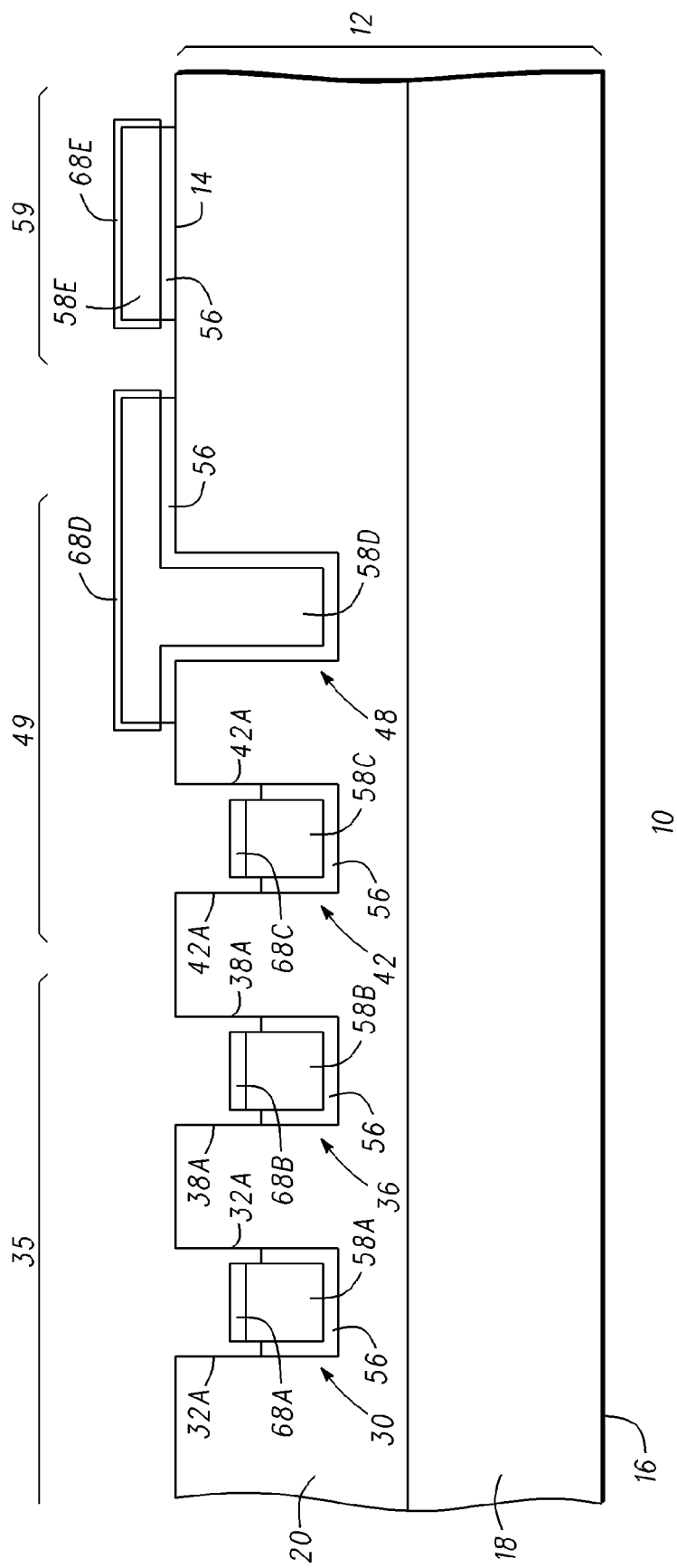
FIG. 5 is a cross-sectional view of the semiconductor component of FIG. 4 at a later stage of manufacture.

Referring now to FIG. 5, the exposed portions of polysilicon layer 58 are etched using, for example, a reactive ion etch to expose portions of oxide layer 56. The etch leaves portions 58A, 58B, and 58C of polysilicon layer 58 in trenches 30, 36, and 42, respectively. Portions 58A and 58B are referred to as shielding electrodes or device electrodes. It should be noted that shielding electrodes 58A, 58B, and 58C preferably will be connected to the source electrode in a subsequent step. The etch also leaves portions 58D and 58E of polysilicon layer 58, where portions 58D and 58E are over portions of oxide layer 56 that are over surface 14 and where portion 58D is also in trench 48. Portions 58C and 58D is also referred to as a termination electrode, a shielding electrode, or a shield. It should be noted that portion 58E is an optional feature that may be omitted from semiconductor component 10 and is referred to as a field stop structure. When included, portion 58E may be connected to the substrate in a subsequent step and serves as a field stop structure and to prevent a parasitic MOSFET from forming due to inversion of the silicon surface. Portions 58A and 58B are in semiconductor device region 35, portions 58C and 58D are in termination region 49, and field stop structure 58E is in drain contact region 59. Masking structure 60 and the exposed portions of oxide layer 56 are removed exposing portions of surface 14 and portions 32A, 38A, and 42A of sidewalls 32, 38, and 42, respectively. By way of example, the exposed portions of oxide layer 56 are removed using a wet etch, which undercuts below the surfaces of polysilicon portions 58A, 58B, and 58C. A sacrificial layer of dielectric material (not shown) is formed on exposed portions 32A, 38A, and 42A and on source electrodes 58A, 58B, 58C, shielding electrode 58D, and field stop structure 58E. In accordance with an embodiment of the present invention, the sacrificial layer of dielectric material is oxide having a thickness ranging from about 100 Å to about 1,000 Å over portions 32A, 38A, and 42A and a thickness ranging from about 200 Å to about 2,000 Å over source electrodes 58A, 58B, 58C, shielding electrode 58D, and field stop structure 58E. The thickness is greater over source electrodes 58A, 58B, 58C, and shielding electrode 58D because of the heavy doping of polysilicon layer 58. The exact ratio of the oxide thickness on the polysilicon to the oxide thickness on the silicon depends on the polysilicon doping and the oxidation conditions. By way of example, the thickness of the layers on sidewalls 32A, 38A, and 48A is about 200 Å and the thickness of the dielectric layer on source electrodes 58A, 58B, 58C, shielding electrode 58D, and field stop structure 58E is about 500 Å. The oxide on sidewalls 32A, 38A, and 42A is removed and the oxide on source electrodes 58A, 58B, 58C, shielding electrode 58D, and portion 58E is thinned leaving oxide layers 68A, 68B, 68C, 68D, and 68E on source electrodes 58A, 58B, 58C, shielding electrode 58D, and field stop structure 58E, respectively.

Figure 6:
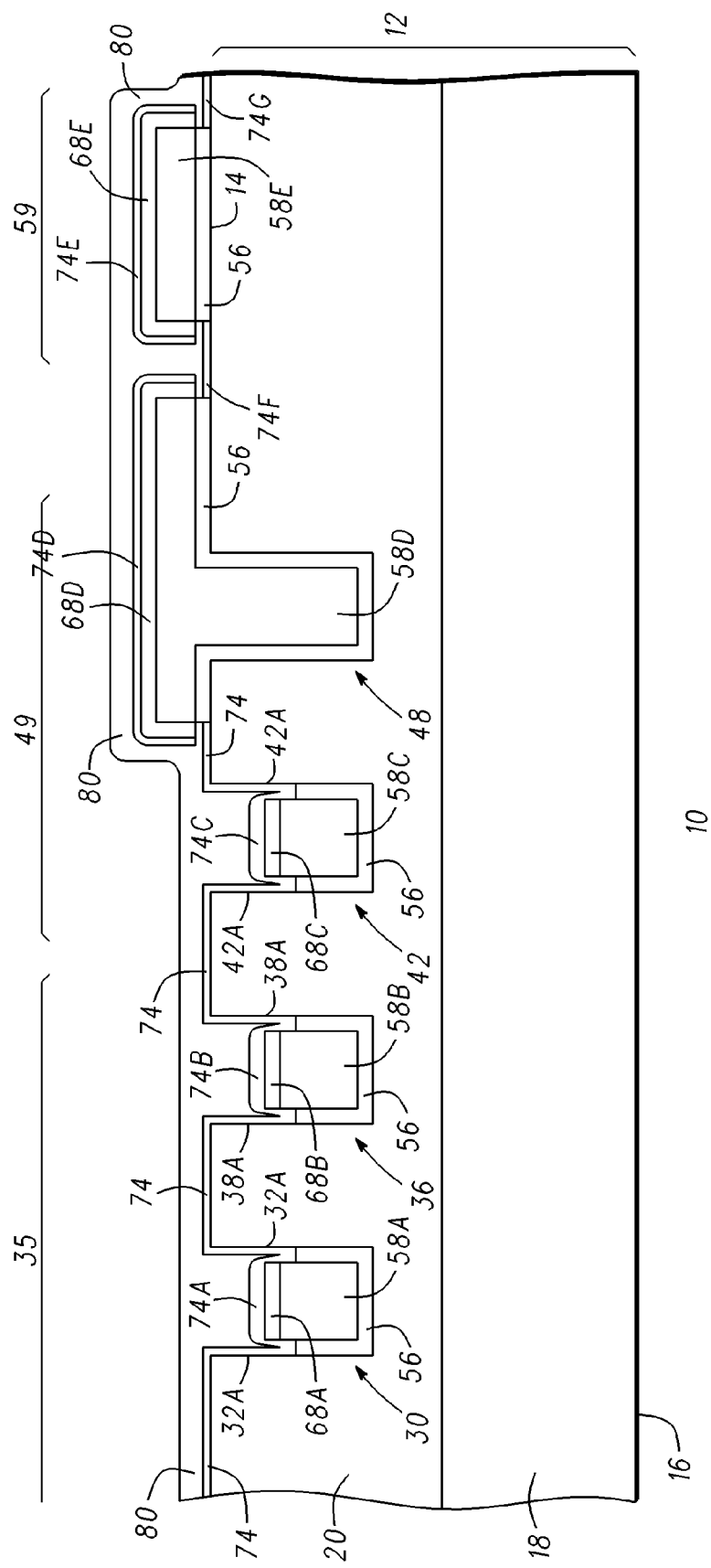
FIG. 6 is a cross-sectional view of the semiconductor component of FIG. 5 at a later stage of manufacture.

Referring now to FIG. 6, a layer of dielectric material 74 is formed on or from exposed portions 32A, 38A, and 42A; layers of dielectric material 74A, 74B, 74C, 74D, and 74E are formed over or from polysilicon portions 58A, 58B, 58C, 58D, and 58E, respectively; a layer of dielectric material 74F is formed on or form the exposed portion of surface 14 that is between termination region 49 and drain contact region 59; and a layer of dielectric material 74G is formed on or from the portion of epitaxial layer 20 that is laterally adjacent to drain region 59. Preferably, the material for dielectric layers 74, 74A, 74B, 74C, 74D, 74E, 74F, and 74G is oxide where the thickness of dielectric layer 74 ranges from about 200 Å to about 1,000 Å and the total thickness of oxide layers 68A and 74A, oxide layers 68B and 74B, oxide layers 68C and 74C, oxide layers 68D and 74D, and oxide layers 68E and 74E ranges from about 1,000 Å to about 4,000 Å. It should be noted that oxide may not be formed on the remaining portions of oxide layer 56. A layer of polysilicon 80 having a thickness ranging from about 6,000 Å to about 10,000 Å is formed on dielectric layers 74 and 74A-74G, and preferably fills trenches 30, 36, and 42.

Figure 7:
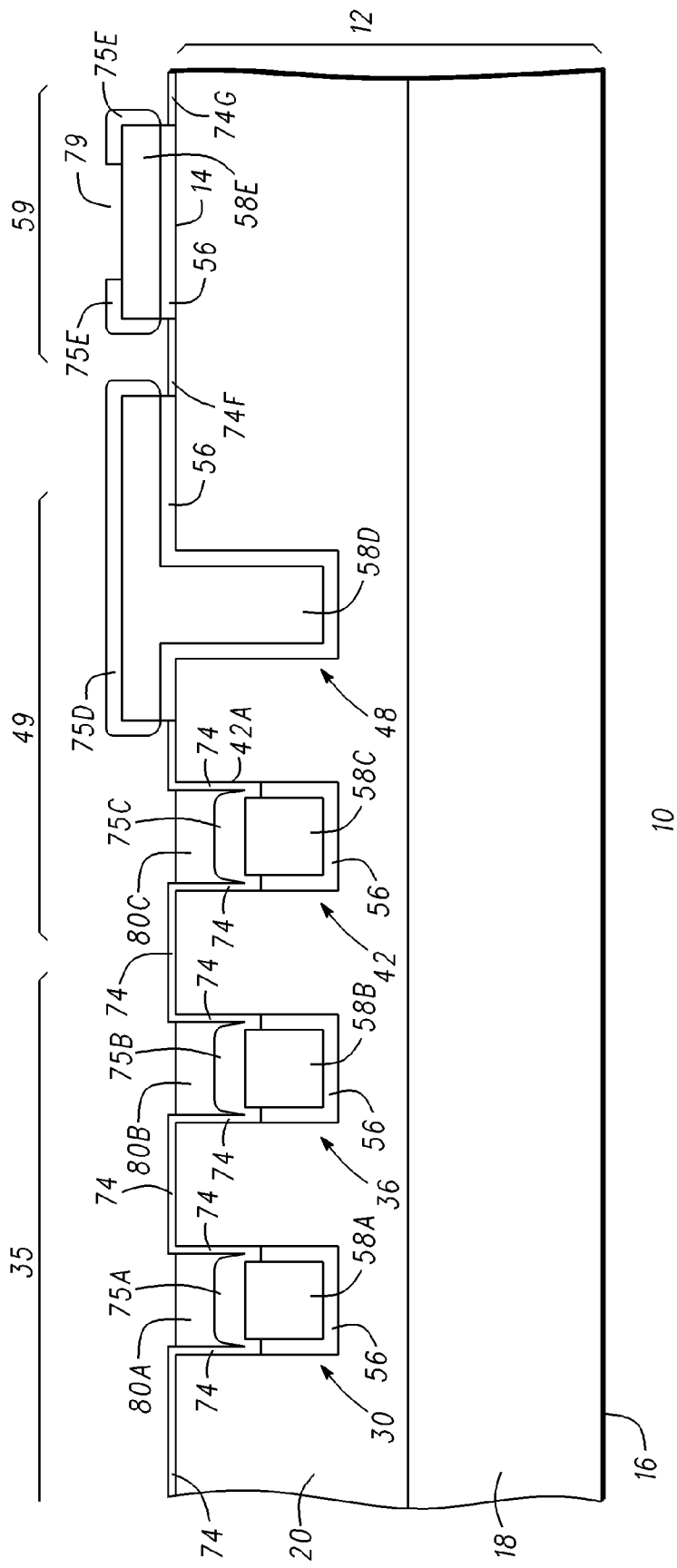
FIG. 7 is a cross-sectional view of the semiconductor component of FIG. 6 at a later stage of manufacture.

Referring now to FIG. 7, polysilicon layer 80 is etched to leave portions 80A, 80B, and 80C, where portions 80A, 80B, and 80C are within trenches 30, 36, and 42, respectively. Portions 80A and 80B serve as gate electrodes or device control electrodes. Gate electrodes 80A and the portions of dielectric layer 74 along sidewalls 32 of trench 30 form a gate structure where the portions of dielectric layer 74 that are between gate electrode 80A and sidewalls 32 serve as a gate dielectric or gate dielectric material, and gate electrode 80B and the portions of dielectric layer 74 along sidewalls 38 of trench 36 form a gate structure wherein the portions of dielectric layer 74 that are between gate electrode 80B and sidewalls 38 serve as a gate dielectric or gate dielectric material. Portion 80C forms a floating electrode. It should be noted that the etch may be accomplished with the use of a mask (not shown) that may be outside the plane of FIG. 7 to leave portions of polysilicon layer 80 on the surface to facilitate formation of a gate electrode connection. Because dielectric layers 74A, 74B, 74C, 74D, 74E and dielectric layers 68A, 68B, 68C, 68D, and 68E are preferably the same material, e.g., oxide, and for the sake of clarity, dielectric layers 74A and 68A are shown as a single layer identified by reference character 75A, dielectric layers 74B and 68B are shown as a single layer identified by reference character 75B, dielectric layers 74C and 68C are shown as a single layer identified by reference character 75C, dielectric layers 74D and 68D are shown as a single layer identified by reference character 75D, and dielectric layers 74E and 68E are shown as a single layer identified by reference character 75E.

Still referring to FIG. 7, an opening 79 is formed in dielectric layer 75E using techniques known to those skilled in the art to expose a portion of field stop structure 58E.

Figure 8:
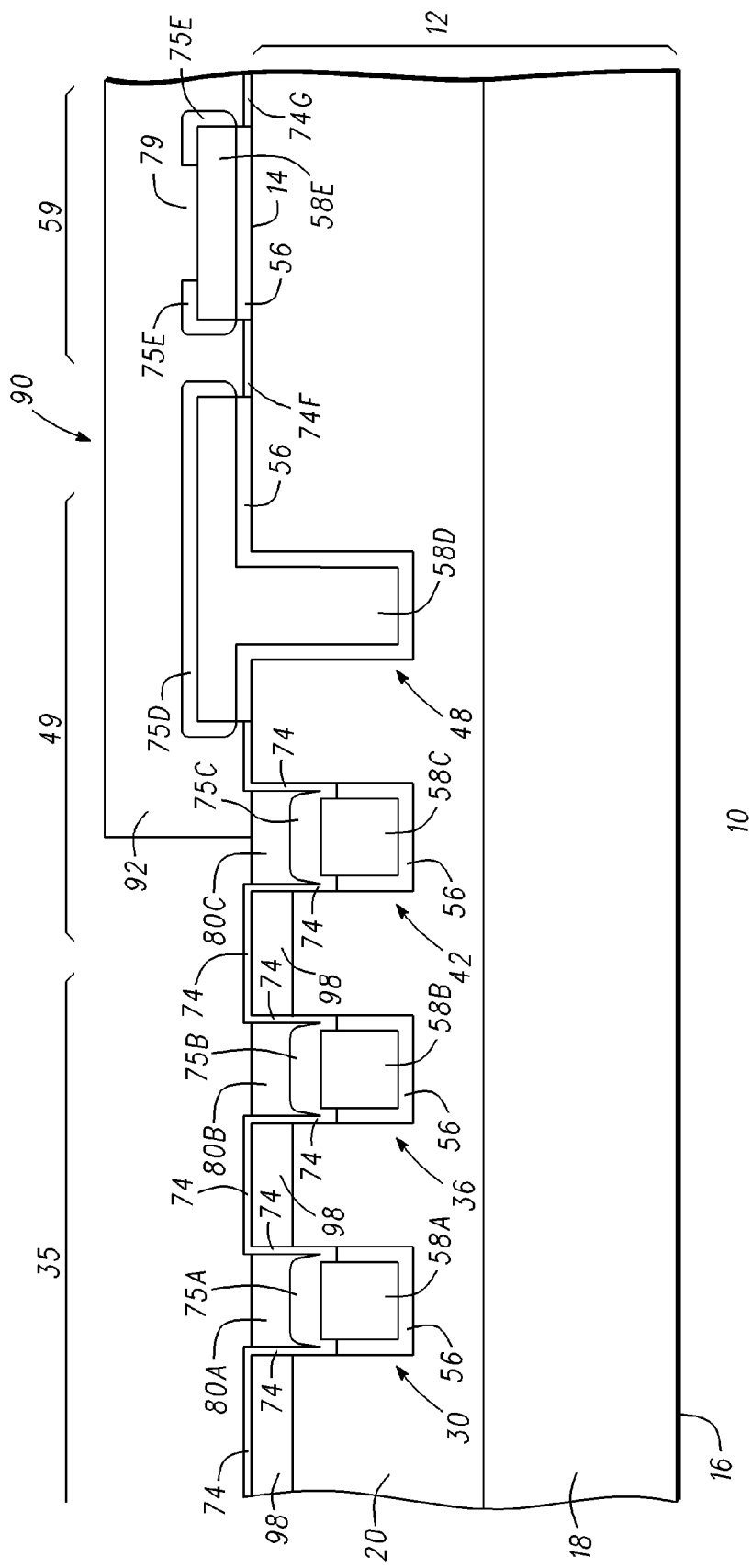
FIG. 8 is a cross-sectional view of the semiconductor component of FIG. 7 at a later stage of manufacture.

Referring now to FIG. 8, a layer of photoresist is patterned over gate electrodes 80A and 80B of polysilicon layer 80 and the exposed portions of dielectric layer 74 to form a masking structure 90 having a masking element 92 and an opening 94. Masking structure 90 is referred to as a high voltage implant mask or a high voltage implant masking structure. Opening 94 exposes portions of dielectric layer 74 and gate electrodes 80A and 80B of polysilicon layer 80. An impurity material of P-type conductivity is implanted into the portions of epitaxial layer 20 that are laterally adjacent to trenches 30 and 36, i.e., the portions of epitaxial layer 20 that are unprotected by masking element 92. The implant forms doped regions 98 which serve as body regions. The impurity material is also implanted into gate electrodes 80A and 80B. It should be noted that formation of doped regions 98 may be accomplished using multiple implants with different energies to tailor the profile of the P-type impurity material in the body regions. The impurity material is also implanted into gate electrodes 80A and 80B. In accordance with an alternative embodiment, this implant can be performed through polysilicon layer 80 using masking structure 90 as an implant mask by implanting the impurity material at a high energy, followed by etching polysilicon layer 80. In accordance with another alternative embodiment, polysilicon layer 80 may be etched until its top surface is about 2,000 Å above surface 14. Then the impurity material of P-type conductivity is implanted through thinned polysilicon layer 80 followed by etching the remaining portions of polysilicon layer 80 until it is recessed into trenches 30, 36, and 42. Masking structure 90 is removed and epitaxial layer 20 is annealed.

Figure 9:
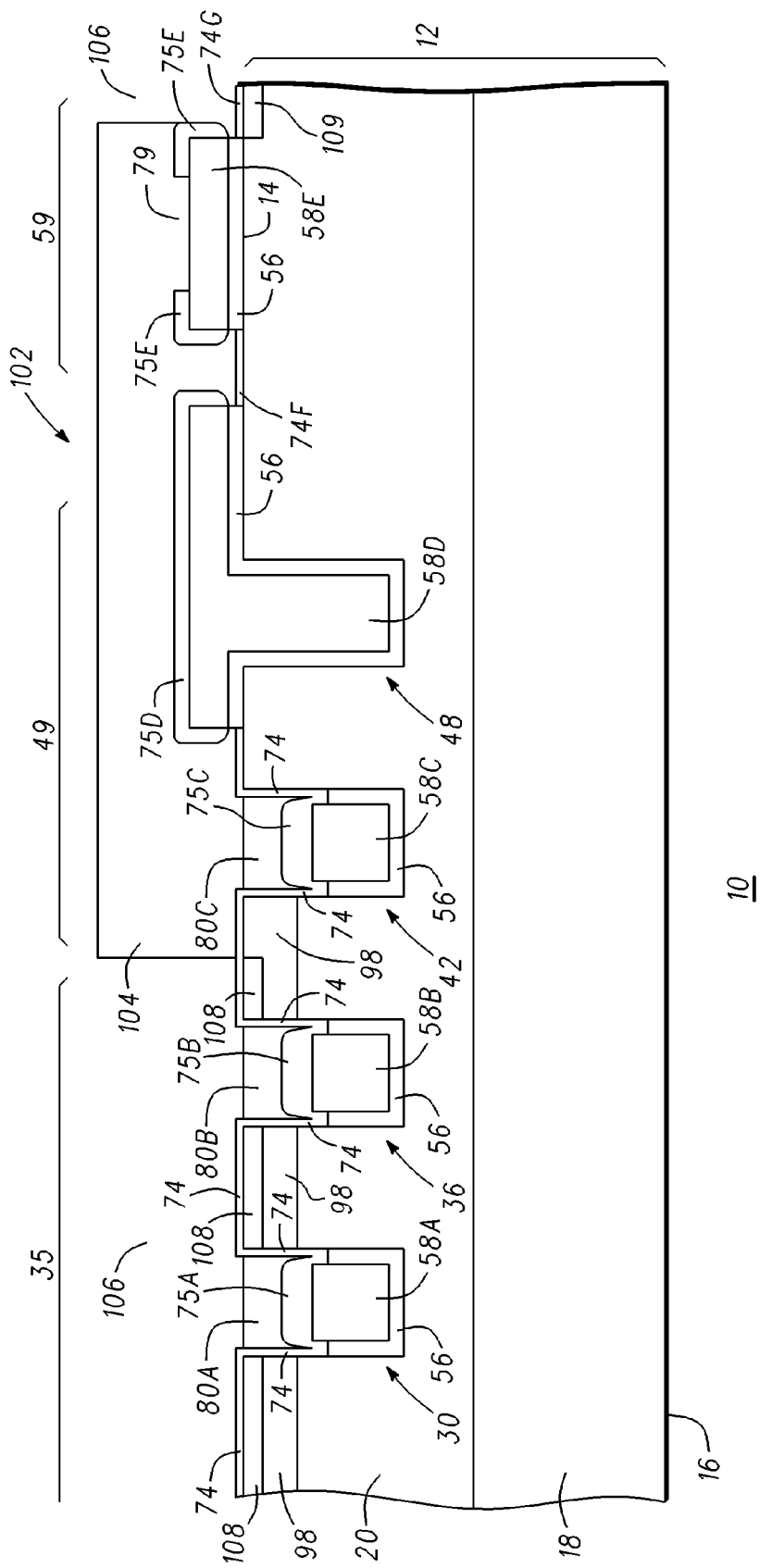
FIG. 9 is a cross-sectional view of the semiconductor component of FIG. 8 at a later stage of manufacture.

Referring now to FIG. 9, a layer of photoresist is patterned over portions of dielectric layer 74 and polysilicon layer 80 to form a masking structure 102 having a masking element 104 and openings 106. Masking structure 102 is referred to as a source/drain implant mask or a source/drain implant masking structure. Openings 106 expose portions of dielectric layer 74, gate electrodes 80A and 80B, and dielectric layer 74G that is in drain contact region 59. An impurity material of N-type conductivity is implanted into the portions of epitaxial layer 20 that are laterally adjacent to trenches 30 and 36 and the unprotected portion of epitaxial layer 20 that is in drain contact region 59, i.e., the portions of epitaxial layer 20 that are unprotected by masking element 102. The implant forms doped regions 108 that serve as source regions and a doped region 109 that serves as a drain contact region. The impurity material is also implanted into gate electrodes 80A and 80B. Masking structure 102 is removed and doped regions 108 and 109 are annealed.

Figure 10:
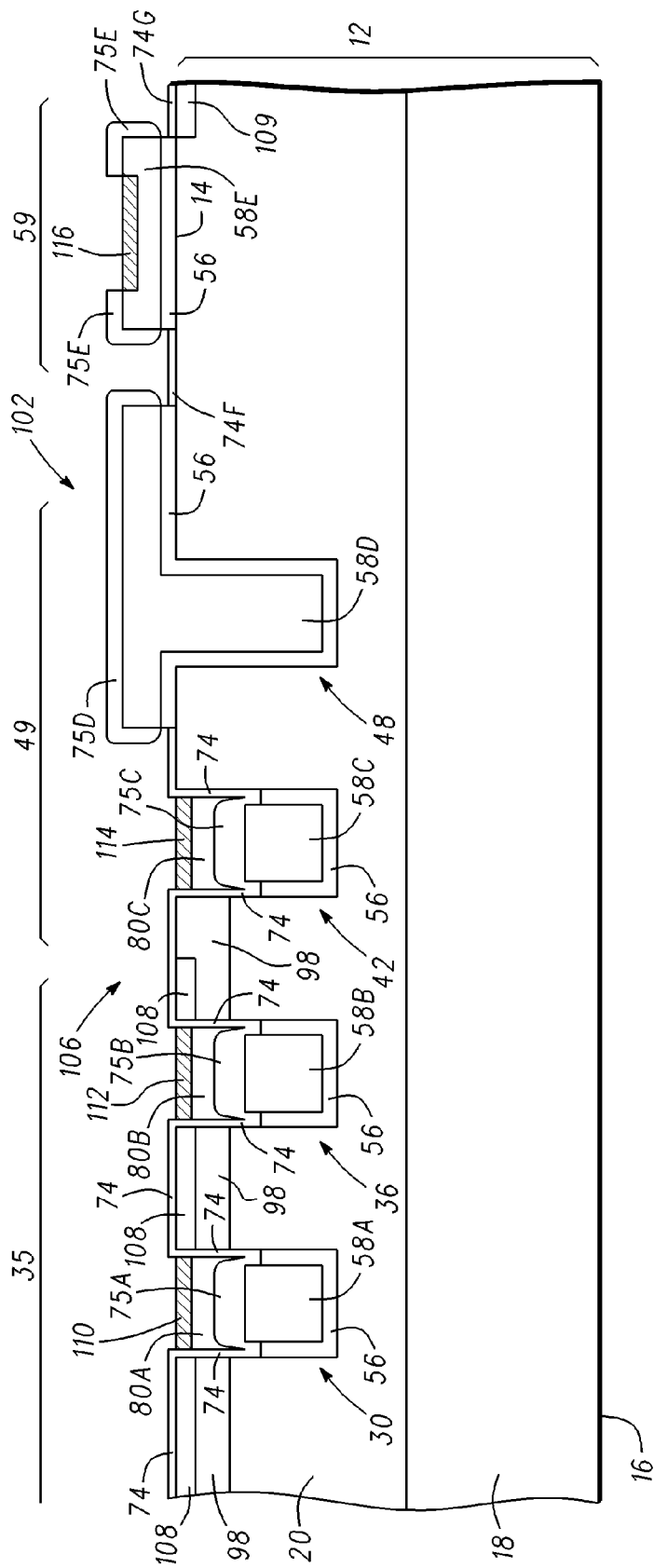
FIG. 10 is a cross-sectional view of the semiconductor component of FIG. 9 at a later stage of manufacture.

Referring now to FIG. 10, gate electrodes 80A and 80B and floating gate electrode 80C are recessed to be below surface 14. Techniques for recessing gate electrodes 80A and 80B and floating gate electrode 80C are known to those skilled in the art. For example, an etch mask (not shown) similar to masking structure 90 may be formed, gate electrodes 80A and 80B and floating gate electrode 80C anisotropically etched, followed by removing the etch mask. Alternatively, electrodes 80A, 80B, and 80C can be recessed in a prior etch step.

Optionally, a layer of refractory metal (not shown) is conformally deposited over gate electrodes 80A, 80B, floating electrode 80C, the exposed portion of field stop structure 58E, and on dielectric layer 74. By way of example, the refractory metal is cobalt having a thickness ranging from about 100 Å to about 1,000 Å. The refractory metal is heated to a temperature ranging from about 450° C. to about 900° C. The heat treatment causes the cobalt to react with the silicon to form cobalt silicide in all regions in which the cobalt contacts polysilicon or silicon. As those skilled in the art are aware, silicide layers that are self aligned are referred to as salicide layers. Thus, cobalt salicide layer 110 is formed from gate electrode 80A, cobalt salicide layer 112 is formed from gate electrode 80B, cobalt salicide layer 114 is formed from floating electrode 80C, and cobalt silicide layer 116 is formed from field stop structure 58E. It should be understood that the type of silicide is not a limitation of the present invention. For example, other suitable silicides include nickel silicide, platinum silicide, titanium silicide, or the like. As those skilled in the art are aware, silicon is consumed during the formation of silicide and the amount of silicon consumed depends on the type of silicide being formed.

Figure 11:
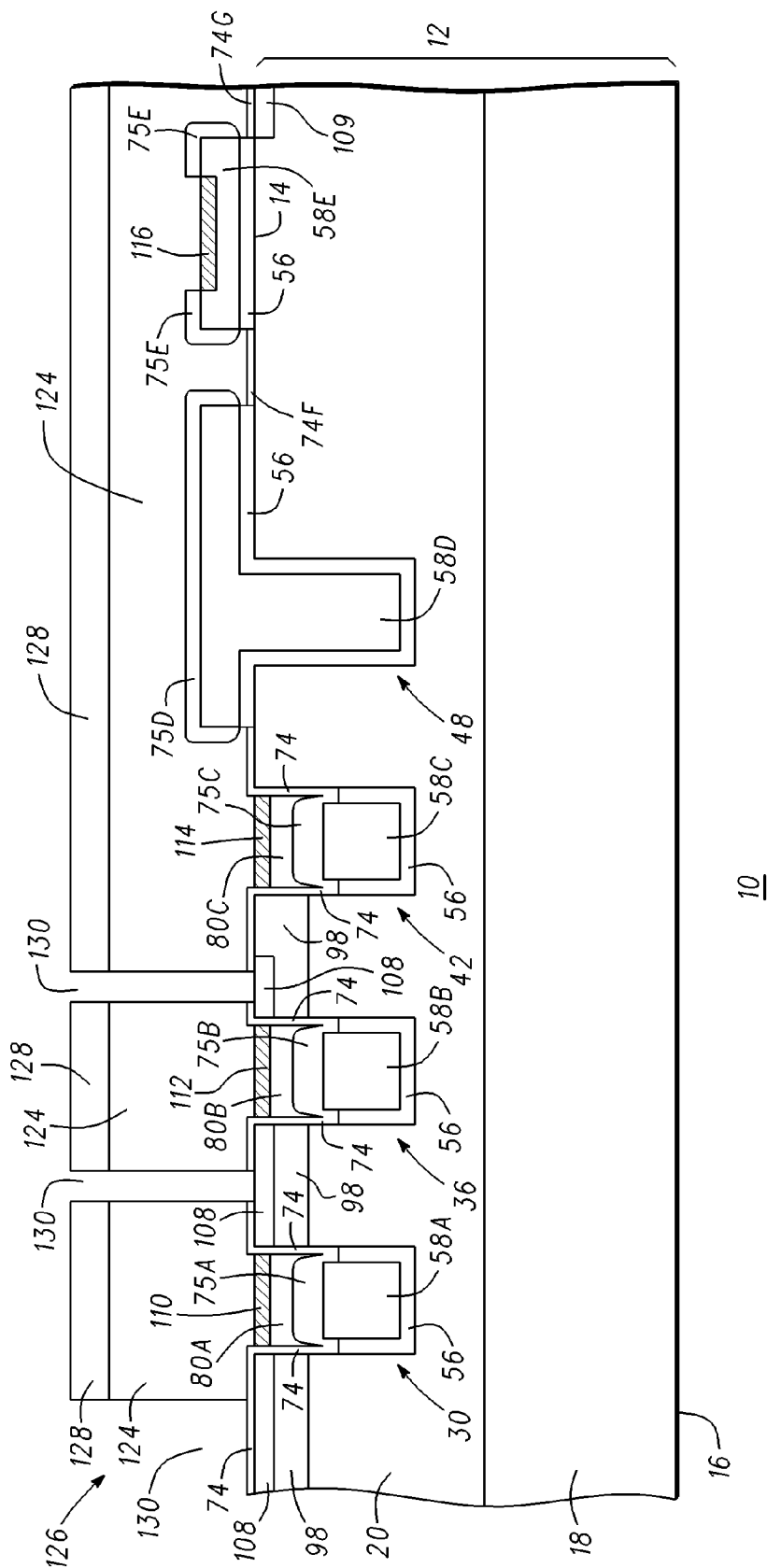
FIG. 11 is a cross-sectional view of the semiconductor component of FIG. 10 at a later stage of manufacture.

Referring now to FIG. 11, a layer of dielectric material 124 having a thickness ranging from about 3,000 Å to about 12,000 Å is formed on salicide layers 110, 112, and 114, silicide layer 116, and dielectric layers 74, 74F, 74G, 75D, and 75E. By way of example, dielectric layer 124 is oxide having a thickness of about 10,000 Å. Dielectric layer 124 may be planarized using, for example, chemical mechanical planarization ("CMP"). Alternately, dielectric layer 124 may be a layer of borophosphosilicate glass ("BPSG") which can be reflowed by heating. A layer of photoresist is patterned over dielectric layer 124 to form a masking structure 126 having masking elements 128 and openings 130 that expose portions of dielectric layer 124. Masking structure 126 is also referred to as a mask or an etch mask. The exposed portions of dielectric layer 124 are anisotropically etched using, for example, a reactive ion etch to form openings in dielectric layer 124 that expose the portion of doped region 108 that is between trenches 30 and 36 and the portions of doped regions 108 that are laterally adjacent to trenches 30 and 36.

Figure 12:
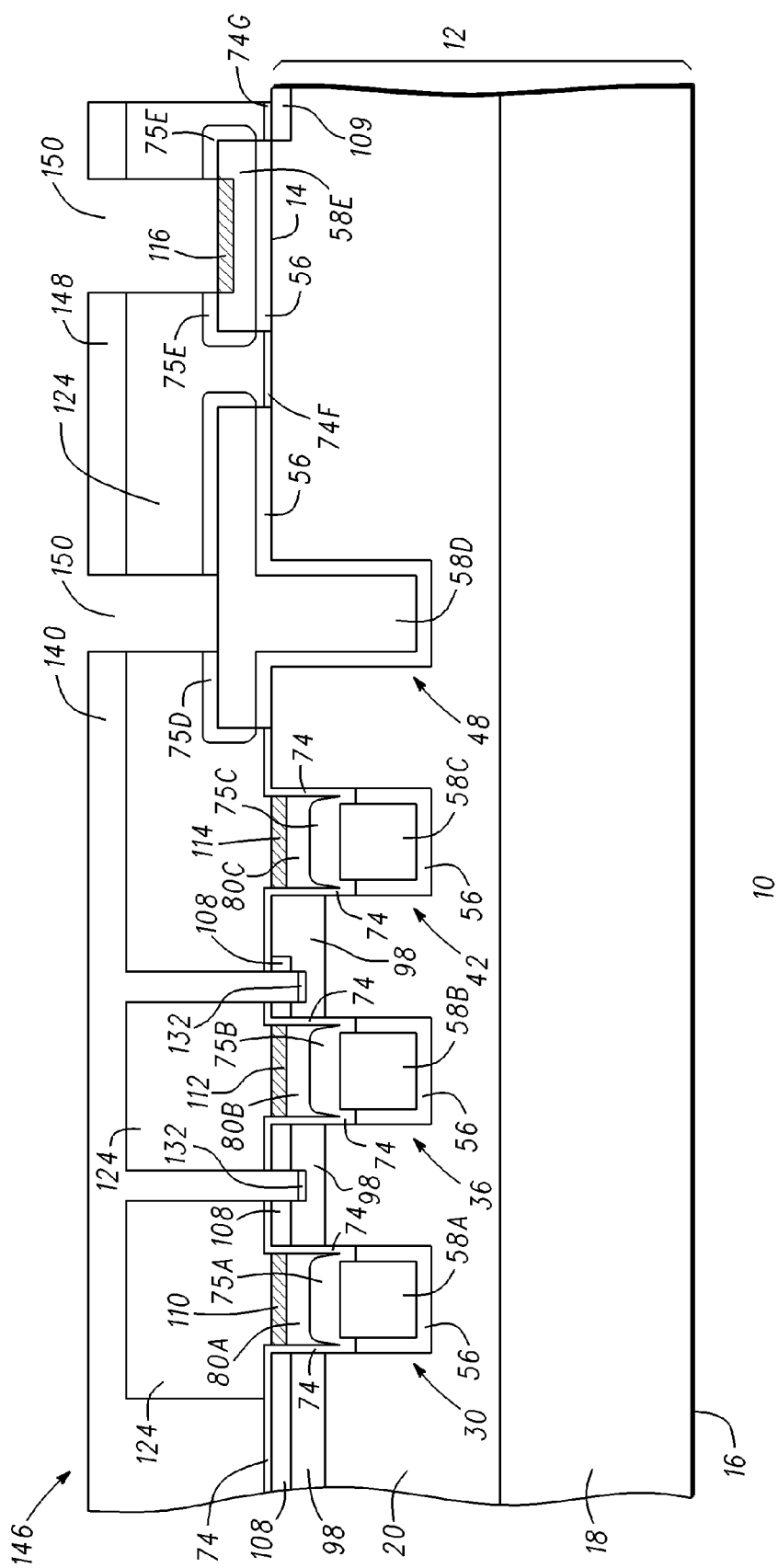
FIG. 12 is a cross-sectional view of the semiconductor component of FIG. 11 at a later stage of manufacture.

Referring now to FIG. 12, masking structure 126 is removed. The exposed portions of epitaxial layer 20 are recessed to a depth slightly deeper than source regions 108 using techniques known to those skilled in the art. An impurity material of P-type conductivity is implanted into the exposed portions of epitaxial layer 20 that are laterally adjacent to trenches 30 and 36, i.e., the portions of epitaxial layer 20 that are unprotected by dielectric layer 124 to form doped regions 132. The implant is then annealed. A layer of photoresist is patterned over dielectric layer 124 to form a masking structure 146 having masking elements 148 and openings 150. The masking structure is referred to as a contact etch mask or a contact etch masking structure. The portions of dielectric layer 124 exposed by openings 150 are etched using techniques known to those skilled in the art to expose a portion of salicide layer 116, a portion of non-floating termination electrode 58D, and a portion of doped region 109 that is adjacent portion 58E. Masking structure 146 is removed. Although not shown, it should be understood that a silicide may be formed from the portions of termination electrode 58D and doped region 109 exposed by openings 150.

Figure 13:
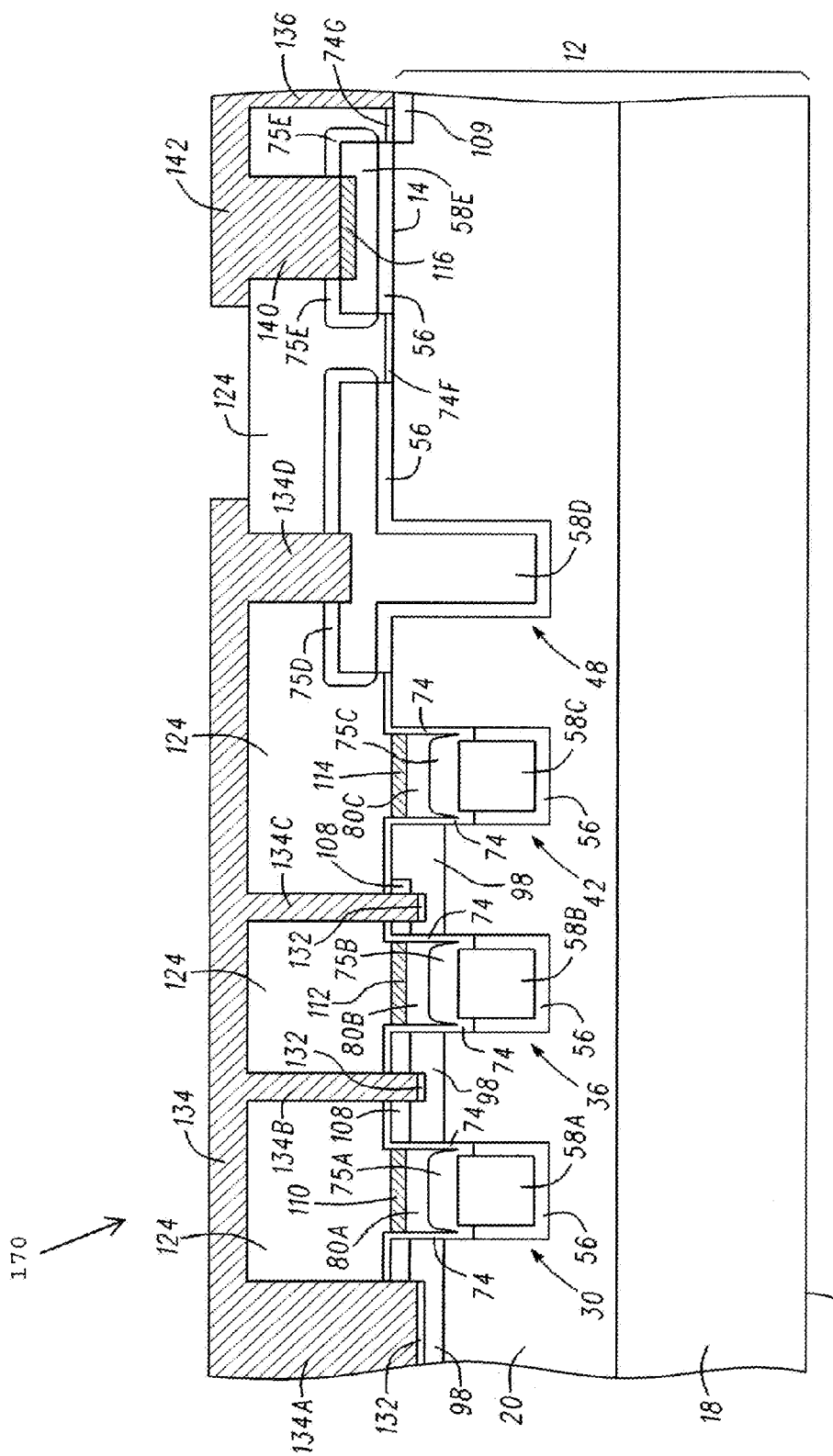
FIG. 13 is a cross-sectional view of the semiconductor component of FIG. 12 at a later stage of manufacture.

Referring now to FIG. 13, a barrier layer is formed in contact with doped regions 132, source/drain regions 108 and 109, non-floating termination electrode 58D, and on dielectric layer 124. Suitable materials for the barrier layer include titanium nitride, titanium tungsten, or the like. A metallization system (not shown) such as, for example, an aluminum-copper (AlCu) metallization system, is formed in contact with the barrier layer. A masking structure is formed on the AlCu metallization system to expose portions of the AlCu metallization structure. The AlCu metallization structure is etched to form a source conductor 134 having source electrode portions 134A, 134B, 134C, and 134D, a top side drain electrode 136, and a field stop electrode 140, which is electrically coupled to top side drain electrode 136 by conductor 142. It should be noted that etching the AlCu metallization structure also forms a gate electrode (not shown) in contact with silicide layers 110 and 112.

Figure 14:
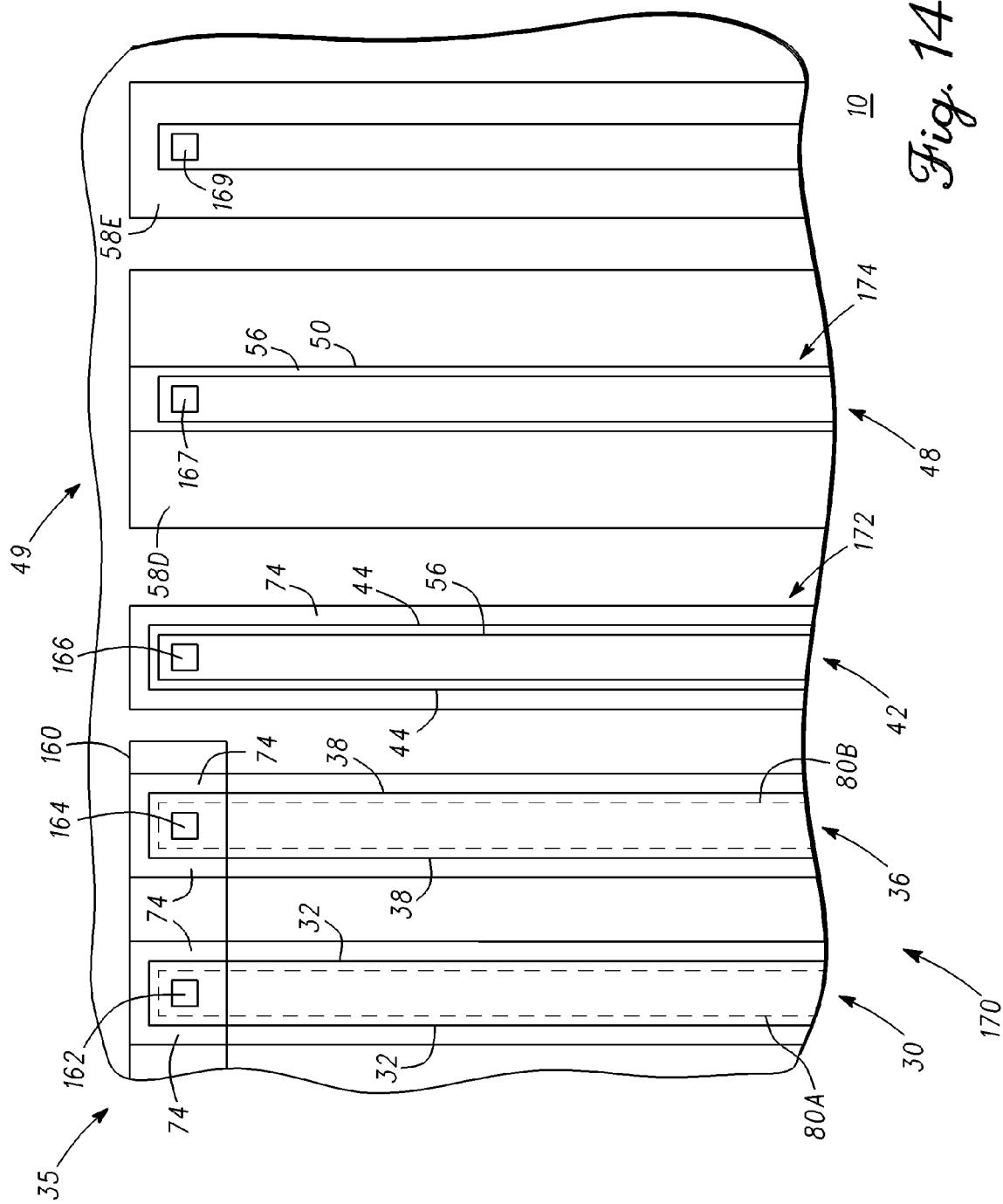
FIG. 14 is a top view of the semiconductor component of FIGS. 5-13 during manufacture that illustrates electrically conductive material in trenches that are electrically coupled together.

FIG. 14 is a top view of semiconductor component 10 during manufacture and illustrates that gate electrodes 80A and 80B are electrically coupled together. It should be noted that gate electrodes 80A and 80B are indicated by broken lines. More particularly, FIG. 14 illustrates a conductive strap 160 electrically coupling gate electrodes 80A and 80B through filled vias 162 and 164. The vias are filled with an electrically conductive material. For the sake of clarity, various layers have been omitted from FIG. 14 to better illustrate that gate electrodes 80A and 80B are electrically connected to each other. It should be noted that source electrode portions 134A, 134B, and 134C are electrically coupled together by source conductor 134. FIG. 14 also illustrates a via 167 filled with an electrically conductive material that contacts non-floating termination electrode 58D and a via 169 filled with an electrically conductive material that contacts field stop structure 58E.

Referring again to FIG. 13, a MOSFET 170 is formed from semiconductor device region 35, wherein doped regions 108 form the source region, the portions of epitaxial layer 20 and substrate 18 that are laterally adjacent to trenches 30 and 36 form the drain region, and electrodes 134A, 134B, and 134C serve as the source electrodes. MOSFET 170 has a top-side drain contact 136. Semiconductor component 10 includes an edge termination structure 172 comprising a floating termination electrode 80C formed over a source electrode 58C and an edge termination structure 174 comprising a non-floating termination electrode or non-floating shield 58D formed in termination region 49. As discussed above, top side drain contact 136 may be electrically coupled to field stop electrode 140.

Figure 15:
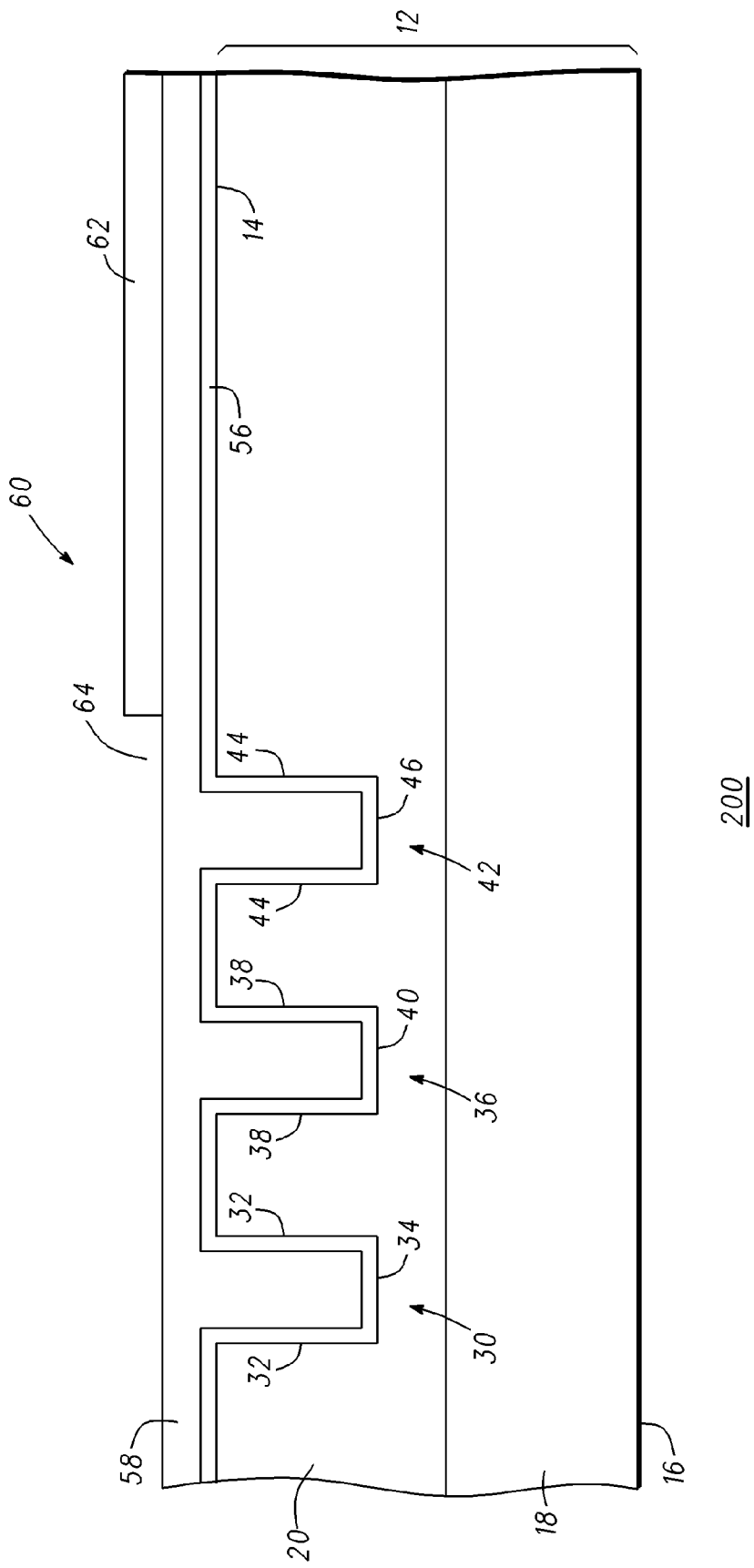
FIG. 15 is a cross-sectional view of a semiconductor component during manufacture in accordance with another embodiment of the present invention.

FIG. 15 is a cross-sectional view of a semiconductor component 200 during manufacture in accordance with another embodiment of the present invention. It should be noted that the steps for manufacturing semiconductor component 200 are similar to those for manufacturing semiconductor component 10 except that trench 48 of semiconductor conductor component 10 is not formed in semiconductor component 200. Instead, a shield plate 202 (shown in FIG. 16) is formed. What is shown in FIG. 15 is semiconductor substrate 12 having trenches 30, 36, and 42, dielectric layer 22, polysilicon layer 58, and masking structure 60. The steps for manufacturing trenches 30, 36, 42, dielectric layer 56, polysilicon layer 58, and masking structure 60 have been described with reference to FIGS. 1-4. However, a masking structure similar to masking structure 24 of FIG. 1 has been modified to prevent the formation of trench 48. Thus, trench 48 is absent from FIG. 15.

Figure 16:
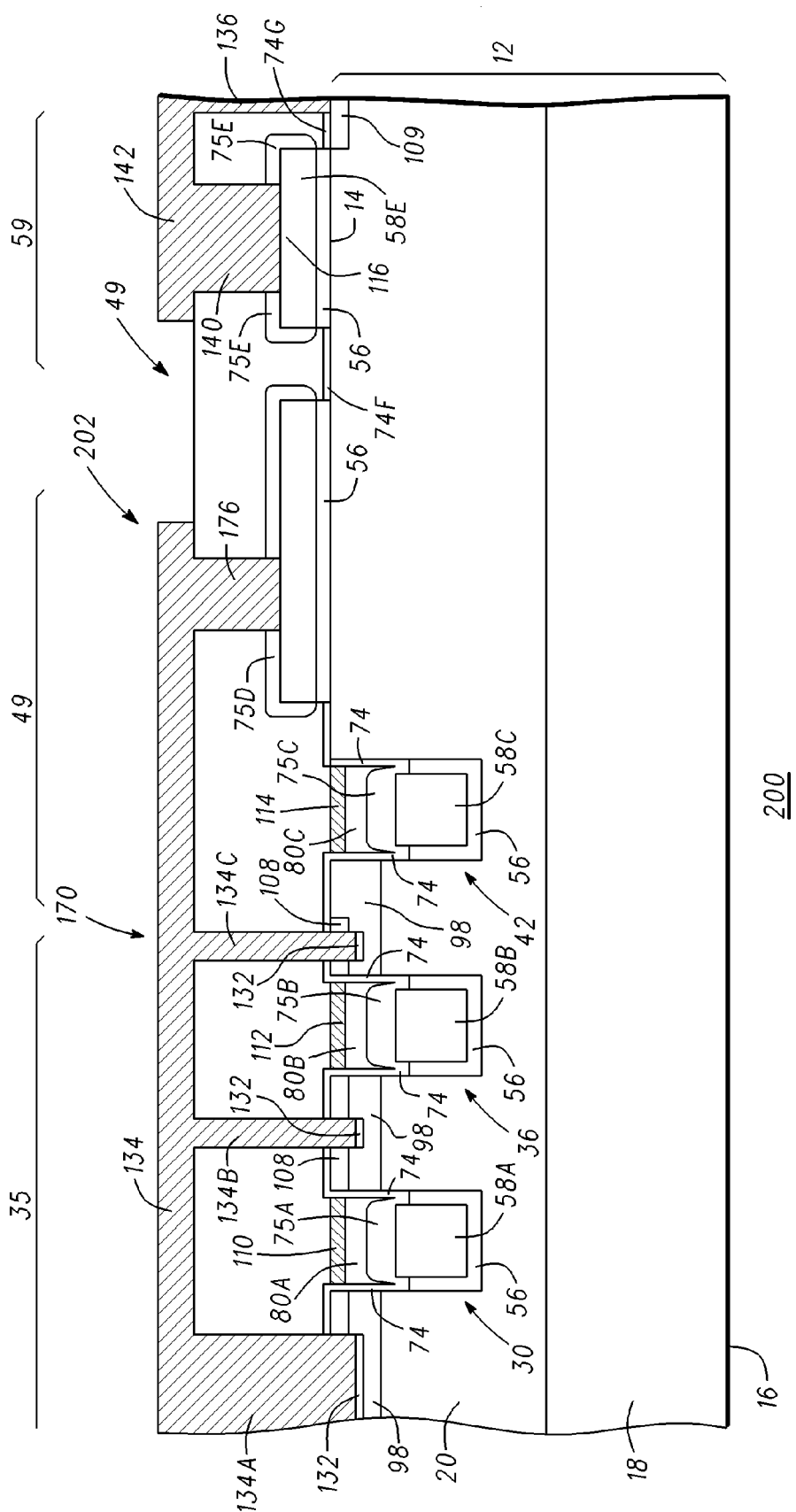
FIG. 16 is a cross-sectional view of the semiconductor component of FIG. 15 at a later stage of manufacture.

FIG. 16 is a cross-sectional view of semiconductor component 200 of FIG. 15 at a later stage of manufacture. What is shown in FIG. 16 is MOSFET 170 formed in semiconductor device region 35 and a termination structure 202 formed in termination region 49. Semiconductor component 200 is similar to semiconductor component 10 except that semiconductor component 200 has a trench-less non-floating electrode 176 rather than termination structure 174, i.e., a non-floating termination electrode or floating shield 58D formed in a trench is absent from semiconductor component 200.

By now it should be appreciated that a semiconductor component comprising a semiconductor device and an edge termination structure have been provided. An advantage of including edge termination structures that comprise a floating gate electrode such as floating gate electrode 80C is that the floating gate electrode assumes a voltage that is intermediate between the voltages on the drain and source electrodes, which reduces the electric field across the gate oxide. The reduction in the voltage on the gate oxide enhances the reliability of the device. In addition, termination structures in accordance with embodiments of the present invention allow constant spacing between the trenches, which enables the formation of reduced surface field ("RESURF") regions to reduce the on-resistance (Rds(on)) of the semiconductor components. Furthermore, termination structures manufactured in accordance with embodiments of the present invention offer a low cost advantage because they use fewer masking steps than other edge termination structures.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A semiconductor component, comprising:
    a semiconductor material of a first conductivity type having first and second major surfaces;
    one or more device trenches extending from the first major surface into the semiconductor material, each device trench of the one or more device trenches having first and second sidewalls and a floor;
    a first termination trench extending from the first major surface into the semiconductor material, the first termination trench having first and second sidewalls and a floor;
    a first layer of dielectric material disposed on the floors and portions of the sidewalls adjacent to the floors of the one or more device trenches and the first termination trench;
    a device electrode in each of the one or more device trenches and a first termination electrode on the first layer of dielectric material in the first termination trench;
    a second layer of dielectric material disposed on each device electrode and on the first termination electrode;
    a device control electrode in each of the one or more device trenches and a floating electrode in the first termination trench, wherein each device control electrode is electrically isolated from each device electrode by the second layer of dielectric material, the floating electrode is electrically isolated from the first termination electrode by the second layer of dielectric material, and wherein the floating electrode is electrically isolated from each device electrode and from each device control electrode;
    an impurity material of a second conductivity type in portions of the semiconductor material that are laterally adjacent the first and second sidewalls of the one or more device trenches and the first sidewall of the first termination trench, the impurity material of the second conductivity type absent from the portion of the semiconductor material adjacent the second sidewall of the first termination trench; and
    an impurity material of the first conductivity type in portions of the semiconductor material that have the impurity material of the second conductivity type and that are adjacent the first and second sidewalls of the one or more device trenches.

2. The semiconductor component of claim 1, wherein the one or more device trenches comprise first and second device trenches, wherein a lateral distance between first and second device trenches of the one or more device trenches is substantially the same as a lateral distance between the second device trench of the at least one device trench and the first termination trench.

3. The semiconductor component of claim 1, wherein the first termination electrode is coupled to at least one of the device electrodes in each of the one or more device trenches.

4. The semiconductor component of claim 1, further including:
    a second termination trench extending from the first major surface into the semiconductor material, the second termination trench having a floor and sidewalls;

a portion of the first layer of dielectric material disposed on the floor and the sidewalls of the second termination trench; and a second termination electrode on the first layer of dielectric material in the second termination trench.

5. The semiconductor component of claim 4, wherein the second termination electrode is electrically coupled to the device electrode.

6. A semiconductor component, comprising:

a semiconductor material of a first conductivity type having a device region, a termination region, and first and second major surfaces;

a field effect transistor formed in the device region, the field effect transistor comprising:

a device trench extending from the first major surface into the semiconductor material, the device trench having first and second sidewalls;

first and second doped regions of a second conductivity type in portions of the semiconductor material adjacent the first and second sidewalls of the device trench; and third and fourth doped regions of the first conductivity type in the first and second doped regions, respectively, and adjacent the first and second sidewalls; and a first termination structure formed in the termination region, the first termination structure comprising:

a first termination trench extending from the first major surface into the semiconductor material and having a floor and first and second sidewalls, the first termination trench having first and second portions, wherein the second doped region of the second conductivity type is adjacent the first sidewall of the first termination trench, the fourth doped region of the first conductivity type is not adjacent the first and second sidewalls of the first termination trench;

a first layer of dielectric material on the floor and the first and second sidewalls in the first portion of the first termination trench and on the floor and the first and second sidewalls of the device trench;

a first termination electrode on the first layer of dielectric material in the first termination trench;

a device electrode on the first layer of dielectric material in the device trench;

a second layer of dielectric material on the first termination electrode and on the sidewalls in the second portion of the first termination trench and on the device electrode;

a device control electrode on the second layer of dielectric material in the device trench; and a floating electrode on the second layer of dielectric material in the termination trench, wherein the floating electrode is electrically isolated from the first termination electrode, the control electrode, and from the third and fourth doped regions of the first conductivity type in the first and second doped regions.

7. The semiconductor component of claim 6, wherein the field effect transistor further comprises:

one or more additional device trenches extending from the first major surface into the semiconductor material, wherein each additional device trench of the one or more additional device trenches has first and second portions;

the first layer of dielectric material on the floor and the sidewalls in the first portion of each additional device trench of the one or more additional device trenches;

a source electrode on the first layer of dielectric material;

the second layer of dielectric material on the source electrode;

a gate dielectric material on the sidewalls in the second portion of each additional device trench of the one or more additional device trenches; and a gate electrode on the gate dielectric material in each additional device trench of the one or more additional device trenches.

8. The semiconductor component of claim 6, wherein the first termination electrode on the first layer of dielectric material is electrically coupled to the semiconductor material.

9. The semiconductor component of claim 6, further including:

a second termination structure formed in the termination region, the second termination structure comprising:

a second termination trench extending from the first major surface into the semiconductor material;

the first layer of dielectric material on the floor and the sidewalls of the second termination trench; and a third termination electrode on the first layer of dielectric material.

10. The semiconductor component of claim 9, wherein the third termination electrode on the first layer of dielectric material is electrically coupled to the semiconductor material.

* * * * *